United States Patent
Cooperberg et al.

(10) Patent No.: US 6,804,572 B1
(45) Date of Patent: Oct. 12, 2004

(54) ENHANCED PROCESS AND PROFILE SIMULATOR ALGORITHMS

(75) Inventors: David Cooperberg, Mt. Kisco, NY (US); Vahid Vahedi, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 784 days.

(21) Appl. No.: 09/609,593

(22) Filed: Jun. 30, 2000

Related U.S. Application Data

(63) Continuation-in-part of application No. 09/033,997, filed on Mar. 3, 1998, now Pat. No. 6,151,532.

(51) Int. Cl.[7] ............................ G05B 13/02; H01L 21/00
(52) U.S. Cl. .............................. 700/121; 700/30; 438/9; 703/13
(58) Field of Search ............................... 700/29–31, 97, 700/103, 104, 121; 438/8, 9, 14, 16, 788, 792, 798; 703/6, 13

(56) References Cited

U.S. PATENT DOCUMENTS

| | | | | |
|---|---|---|---|---|
| 5,642,296 A | * | 6/1997 | Saxena | 702/84 |
| 5,819,073 A | * | 10/1998 | Nakamura | 716/20 |
| 5,861,752 A | * | 1/1999 | Klick | 324/464 |
| 6,110,214 A | * | 8/2000 | Klimasauskas | 703/2 |
| 6,136,388 A | * | 10/2000 | Raoux et al. | 427/569 |
| 6,151,532 A | * | 11/2000 | Barone et al. | 700/121 |
| 6,162,709 A | * | 12/2000 | Raoux et al. | 438/513 |
| 6,301,510 B1 | * | 10/2001 | Cooperberg et al. | 700/28 |
| 6,577,915 B1 | * | 6/2003 | Cooperberg et al. | 700/121 |

* cited by examiner

*Primary Examiner*—Albert W. Paladini
*Assistant Examiner*—Douglas S. Lee
(74) *Attorney, Agent, or Firm*—Thelen Reid & Priest LLP; Thierry K. Lo

(57) ABSTRACT

A method enhances a process and profile simulator algorithm to predict the surface profile that a given plasma process will create. The method first tracks an energetic particle and then records the ion fluxes produced by the energetic particle. A local etch rate and a local deposition rate are computed from neutral fluxes, surface chemical coverage, and surface material type that are solved simultaneously.

7 Claims, 6 Drawing Sheets

ENHANCED PROCESS AND PROFILE SIMULATOR ALGORITHMS

CROSS-REFERENCE TO RELATED APPLICATIONS

This is a continuation-in-part of U.S. patent application Ser. No. 09/033,997, filed Mar. 3, 1998 now U.S. Pat. No. 6,151,532 in the names of inventors Maria E. Barone, Richard A. Gottscho, and Vahid Vahedi and commonly assigned herewith. It is also related to Method and Apparatus to calibrate a semi-empirical process simulator and, Applications of a semi-empirical physically based profile simulator filed on common date herewith.

BACKGROUND OF THE INVENTION

1. Field of the Invention

This invention relates to plasma processing of semiconductor devices. In particular, this invention provides a method for enhancing process and profile simulator algorithms for predicting the surface profile that a given plasma process will create.

2. Background Art

Various forms of processing with ionized gases, such as plasma etching and reactive ion etching, are increasing in importance particularly in the area of semiconductor device manufacturing. Of particular interest are the devices used in the etching process. FIG. 1A illustrates a conventional inductively coupled plasma etching system 100 that may be used in the processing and fabrication of semiconductor devices. Inductively coupled plasma processing system 100 includes a plasma reactor 102 having a plasma chamber 104 therein. A transformer coupled power (TCP) controller 106 and a bias power controller 108 respectively control a TCP power supply 110 and a bias power supply 112 influencing the plasma created within plasma chamber 104.

TCP power controller 106 sets a set point for TCP power supply 110 configured to supply a radio frequency (RF) signal, tuned by a TCP match network 114, to a TCP coil 116 located near plasma chamber 104. A RF transparent window 118 is typically provided to separate TCP coil 116 from plasma chamber 104 while allowing energy to pass from TCP coil 116 to plasma chamber 104.

Bias power controller 108 sets a set point for bias power supply 112 configured to supply a RF signal, tuned by a bias match network 120, to an electrode 122 located within the plasma reactor 104 creating a direct current (DC) bias above electrode 122 which is adapted to receive a substrate 124, such as a semi-conductor wafer, being processed.

A gas supply mechanism 126, such as a pendulum control valve, typically supplies the proper chemistry required for the manufacturing process to the interior of plasma reactor 104. A gas exhaust mechanism 128 removes particles from within plasma chamber 104 and maintains a particular pressure within plasma chamber 104. A pressure controller 130 controls both gas supply mechanism 126 and gas exhaust mechanism 128.

A temperature controller 134 controls the temperature of plasma chamber 104 to a selected temperature setpoint using heaters 136, such as heating cartridges, around plasma chamber 104.

In plasma chamber 104, substrate etching is achieved by exposing substrate 124 to ionized gas compounds (plasma) under vacuum. The etching process starts when the gases are conveyed into plasma chamber 104. The RF power delivered by TCP coil 116 and tuned by TCP match network 110 ionizes the gases. The RF power, delivered by electrode 122 and tuned by bias match network 120, induces a DC bias on substrate 124 to control the direction and energy of ion bombardment of substrate 124. During the etching process, the plasma reacts chemically with the surface of substrate 124 to remove material not covered by a photoresistive mask.

Input parameters such as plasma reactor settings are of fundamental importance in plasma processing. The amount of actual TCP power, bias power, gas pressure, gas temperature, and gas flow within plasma chamber 104 greatly affects the process conditions. Significant variance in actual power delivered to plasma chamber 104 may unexpectedly change the anticipated value of other process variable parameters such as neutral and ionized particle density, temperature, and etch rate.

Traditionally, a suite of values of these input parameters suitable for creating a given set of device features has been determined by trial and error. Development of a single process by this empirical approach is costly and time-consuming, requiring treatment of several patterned wafers and subsequent study of the resulting profiles by scanning electron microscopy. Because of the unpredictable way a small change in one input parameter may affect the profile, any modification of the layout—for example, in device dimension, pattern density on the wafer or change in total open area—from one application to another, has often necessitated redevelopment of the process, with the attendant outlay of resources.

Recent advances in device fabrication technology are rendering this approach even more onerous. Decreasing feature sizes demand tighter tolerances on feature dimensions and morphologies, so that the number of trials required to optimize a given process is increasing. The acceleration of wafer diameter growth and the complete redesign of the process involved with an incremental change in diameter have increased the number of times this empirical process must be repeated. The increasing use of devices tailor-made to a specific application also increases the amount of development and optimization activity required.

An alternative, computational approach would derive input parameters from a complete physical description of a plasma process including a plasma model for describing the coupling between the macroscopic input parameters and the macroscopic fluxes, concentrations and energy distributions of the various species in the plasma; and a profile simulator for determining atomistically from the macroscopic fluxes the resulting etch or deposition rate along the wafer surface and calculating the profile evolution therefrom. Ideally, such a physical description of plasma etching and deposition processes would enable the ab initio selection of the macroscopic input parameters appropriate for generating a desired profile on the substrate, eliminating the need for expensive and time-consuming test sequences.

Research in this field has done much to elucidate mechanisms at work in plasma processes, and thus has contributed scaling laws that could frame a physical description. However, notwithstanding the availability of computational means sufficiently powerful to perform the necessary calculations based on known scaling laws, the implementation of such an ab initio approach has been limited by lack of data. For example, the manner in which the values of some coefficients in these laws depend on the particulars of a given process is unknown as yet. In some investigations, determination of the value of such a scaling coefficient consistent with a plasma process defined by a given set of input parameters has been done by comparing a finished profile, created by applying that process, with a simulated profile including one or more of these coefficients as adjustable parameters. Such hindsight evaluation may promote understanding a given coefficient's role in scaling law, but it has not afforded the ability to predict profile evolution for any process defined by a set of input parameters differing from the set used in the experimental process used to derive the value of that coefficient.

Thus, there is a need for a method for enhancing the algorithms of a process and profile simulator to accurately predict the surface profile that a given plasma process will create.

SUMMARY OF THE INVENTION

The present invention is a method for enhancing a process and profile simulator algorithm for predicting the surface profile that a given plasma process will create. The method first tracks an energetic particle and records ion fluxes produced by the energetic particle. A local etch rate and a local deposition rate are computed from neutral fluxes, a surface chemical coverage, and a surface material type that are solved simultaneously.

The neutral fluxes, surface chemical coverage, and surface material type are simultaneously solved by first computing neutral fluxes. Site balance equations are first self-consistently solved using the neutral fluxes. An etch rate of a depositing film is then calculated using solutions of the site balance equations. The surface material type is adjusted to the depositing film or an underlying material type accordingly based on the etch rate of the depositing film. The method repeats solving for neutral fluxes, surface chemical coverage, and surface material type until they are self-consistent with each other.

The neutral fluxes can be analytically calculated, for greater accuracy and improved computational efficiency by calculating a direct flux contribution, a reemission flux, and a transmission matrix for each neutral specie. The previous computation is repeated for all neutral species.

The simulation of a plasma etching or depositing process is also enhanced by extrapolating a description of the feature profiles using Cartesian coordinates and azimuthally symmetric cylindrical coordinates with three degrees of freedom for particle velocity to three spacial degrees of freedom and three degrees of freedom for particle velocity.

DETAILED DESCRIPTION OF A PREFERRED EMBODIMENT

Figure 1A:
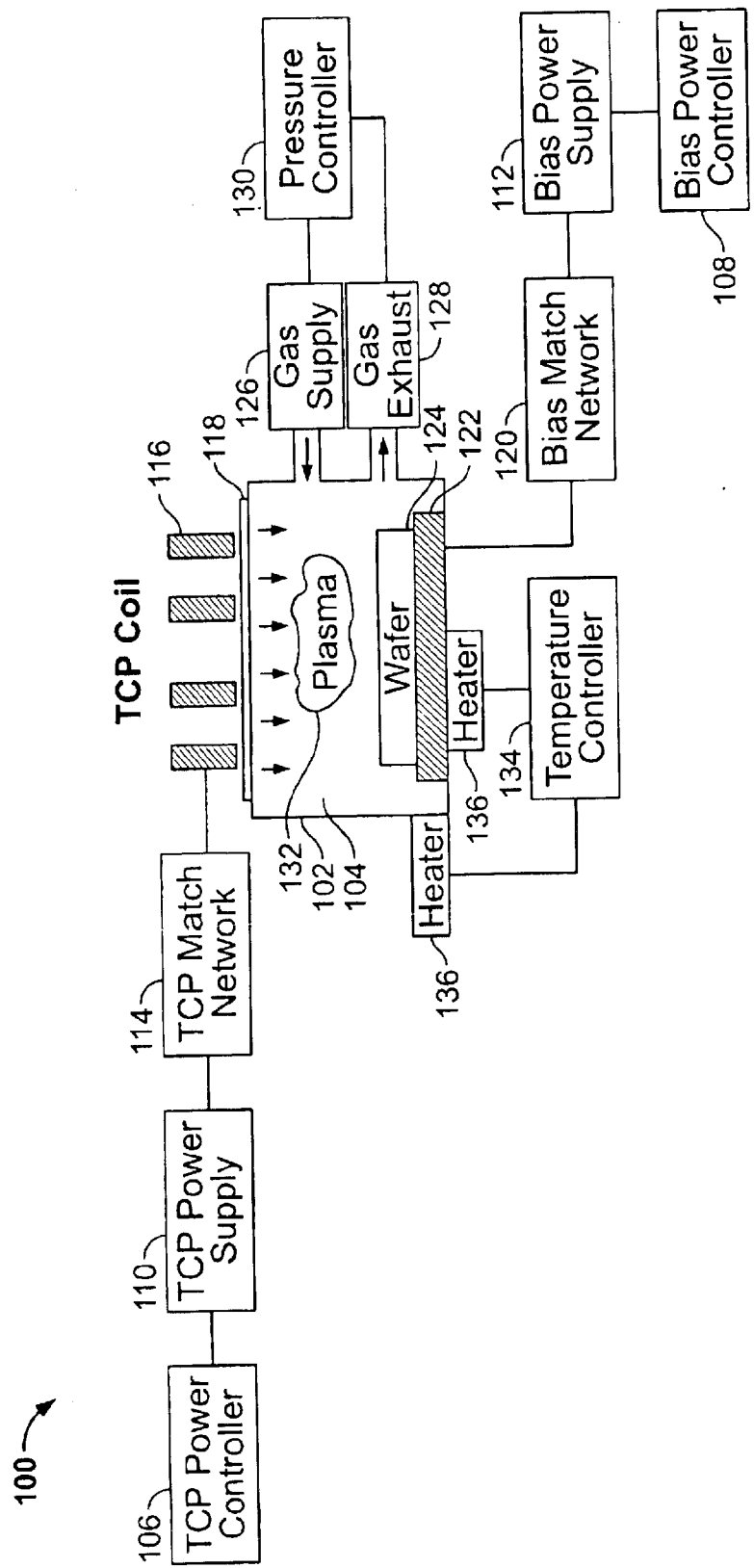
FIG. 1A is a block diagram showing a plasma etching system.

A semi-empirical approach of a profile and process simulator is not limited to any particular macroscopic physical description of the surface profile or underlying plasma model. Mathematical models may incorporate scaling laws derived from basic plasma physics and chemistry, numerical simulations or experiments. In general, a plasma model is configured to return fluxes, energy, and angular distributions arriving at a substrate surface for species of interest, based on macroscopic parameters related to the function of a reactor. The plasma model may entail a complete plasma simulation tool with all known cross-sections for a gas-phase chemistry and plasma surface interactions, or merely a look-up table of experimentally measured fluxes and observed trends.

The profile simulator preferably, for accuracy and versatility, calculates the movement of each segment along a discretized profile surface and thus models the evolution of a feature being processed. An appropriate profile simulator includes a local transport model for calculating local fluxes arriving at each point along a substrate surface, a site balance model for calculating surface chemical coverage (the concentration of reactive, inhibiting, and or depositing species at each point on a substrate surface), a rate model for calculating resulting local etch and deposition rates, and a surface advancement algorithm for translating these mechanisms into net surface movement. In a preferred embodiment, the profile simulator derives the local fluxes from the macroscopic parameters provided by the plasma model using Monte Carlo methods and/or analytic methods. The rate model and the site balance model are preferably based on a Langmuir-type model of the kinetics of particle-surface interactions but may be generalized to represent interactions between particles and a surface mixing layer which can be many monolayers thick. The model characterizes species that remove material from the substrate as etchants and those that deposit material onto the substrate surface as depositors, and those that inhibit surface reactions as inhibitors.

The surface advancement algorithm incorporates a shock-front-tracking approach. Generally speaking, each of these four segments contributes coefficients of unknown value in the profile simulator characterize couplings between the processing medium and the behavior of the substrate surface and this collectively describe the substrate evolution.

In a preferred embodiment, the plasma model characterizes the species of interest only as belonging to a general class of actors, for example, as being either charged particles, and thus attracted to the substrate by any applied bias, or neutral species such as gas molecule and excited radicals. Physical models—for example, Maxwell's and Boltzmann's equations—underlying the functional dependence in terms of governing experimental input parameters of such plasma descriptors as particle fluxes, energy, and angular distributions are well known in the art. (See, e.g., Lieberman and Lichtenberg, *Principles of Plasma Discharges and Materials Processing*, John Wiley, 1994.) Much is known in the art about how these descriptors scale with the input parameters, based on such basic physical models in conjunction with experimental data. However, the absolute value of these fluxes or distributions is not known a priori for a given process.

The present invention therefore seeks to provide algorithms that accurately predicts the dynamics of a plasma etching system as illustrated in FIG. 1A, more particularly, the interactions of energetic particles bombarding a semiconducting substrate, such as a wafer. The method uses and combines the models (local transport model, site balance model, rate model, surface advancement algorithm) into several computation processes in which solutions are solved simultaneously and consistently.

Figure 1B:
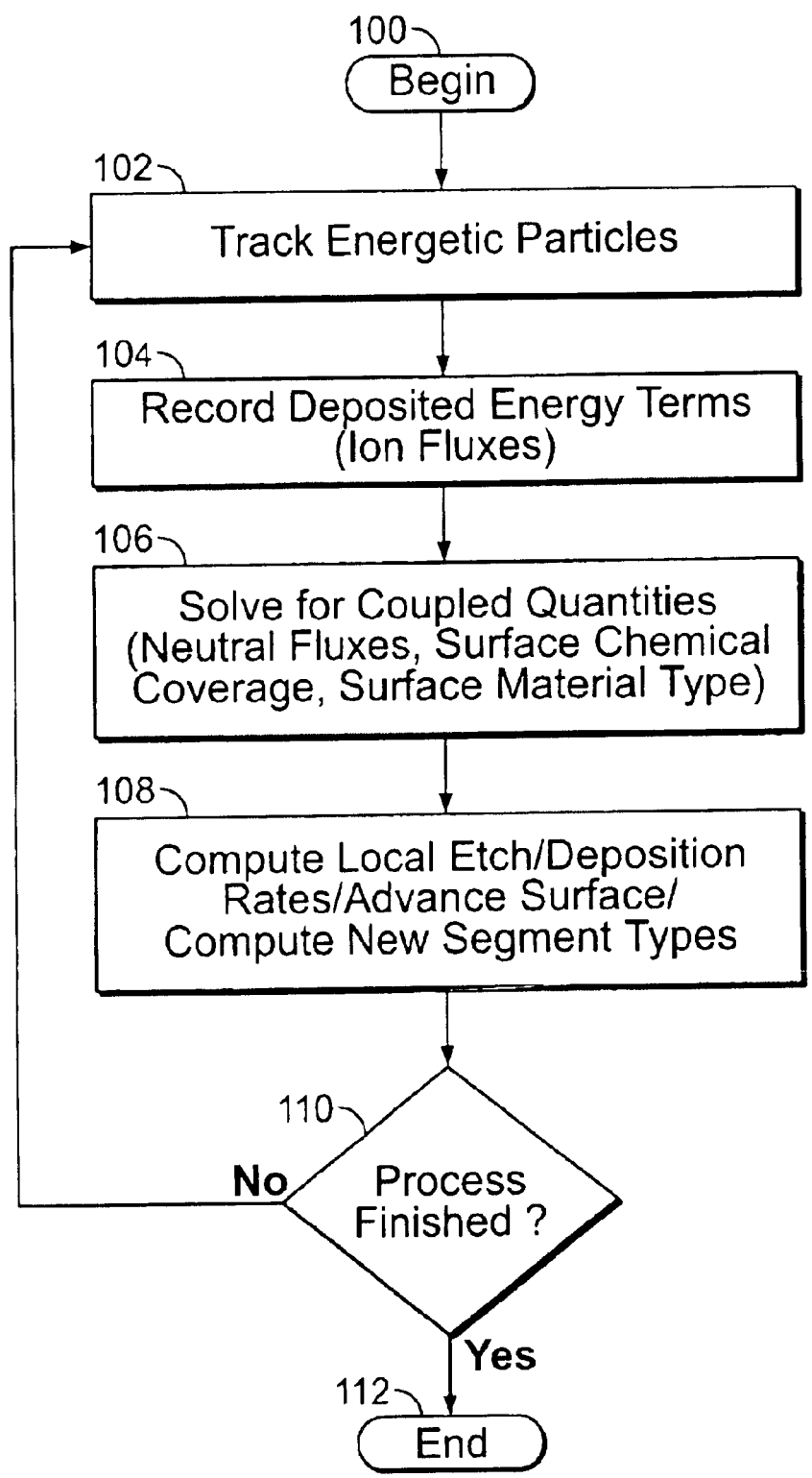
FIG. 1B is a flow chart illustrating a method to self-consistently calculate material types, chemical coverage, neutral and ion fluxes to a surface segment within a feature profile in order to compute the etch rate along the feature profile.

FIG. 1B illustrates a process and method to self-consistently calculate material types, surface chemical coverage, neutral and ion fluxes to a surface segment within a feature profile in order to compute the etch or deposition rate along the feature profile. The method begins at block 100. In block 102, energetic particles trajectories, such as ion trajectories, are tracked until they leave the simulation domain. Ions within a plasma reactor travel towards a substrate placed on an electrode. When the ions encounter the surface of the substrate, they are either reflected or absorbed. The tracking of the trajectories is accomplished by integrating the energetic particles' equation of motion and using empirical or published theoretical model for ion-wall interactions. In block 104, the deposited energy terms at each surface segment for each material type, such as silicon, polymers, or deposited films, are then recorded for use in the site balance and rate models. Usually, the ion fluxes are determined by the plasma model.

Figure 2:
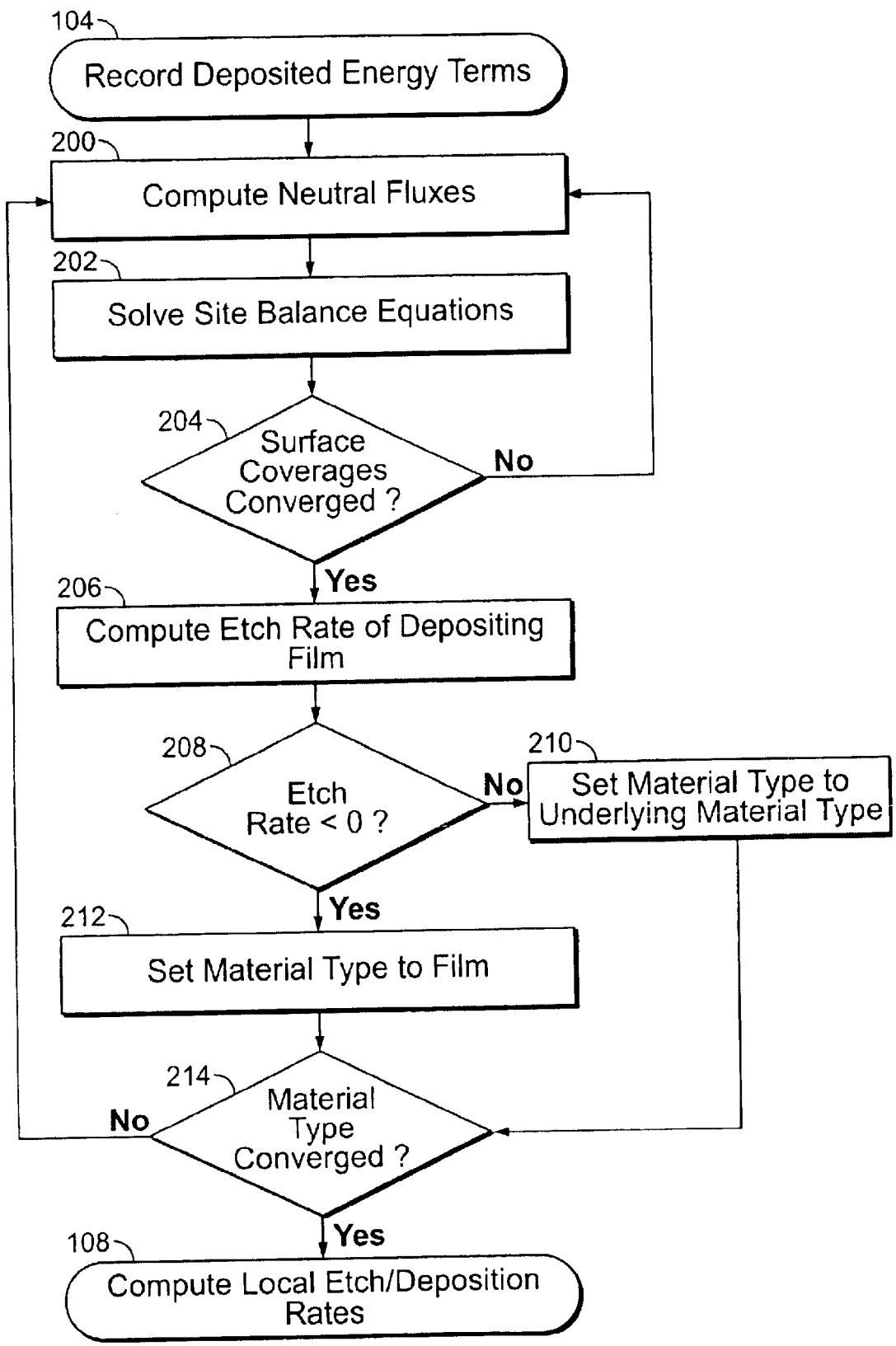
FIG. 2 is a flow chart illustrating a method to self-consistently and simultaneously solve for coupled quantities including surface chemical coverage, incident neutral fluxes, and surface material type at each segment along a feature profile.

Coupled quantities such as neutral fluxes, surface chemical coverage, and surface material type at each segment along a feature surface are then simultaneously and self-consistently solved for in block 106. Because each quantity is codepident upon each other, the computation involves simultaneous computation and multiple verification of the integrity and consistency of coupled quantities solved for with each equation. FIG. 2 illustrates the details of the simultaneous computation.

Block 108 then uses the results of block 106 to compute local etch and deposition rates and new segment types using a standard surface advancement algorithm. Indeed, it is preferred to employ an analytic scheme for surface advancement so that fine features can be resolved more accurately. One such scheme known in the art and capable of modeling fine feature aspects, such as sharp corners, is the method of characteristics, also known as shock-front-tracking algorithm. (See, e.g., S. Hamaguchi, "Modeling of Film Deposition for Microelectronic Applications", *Thin Films*, vol. 22, p. 81, S. Rossnagel, ed, Academic Press, San Diego, 1996). Another is the level set approach. (See, e.g., J. A. Sethian, Level Set Methods: *Evolving Interfaces in Geometry, Fluid Mechanics, Computer Vision, and Materials Science*, Cambridge University Press 1996.) The stock-front-tracking approach models the surface (i.e., the interface layer between vacuum and solid) as a collection of piecewise continuous line segments, for each of which a rate of movement is calculated. The possibility of each segment's advancing or receding along its normal independently of the movement of the other segments allows for multiple potential solutions for the resulting surface. In order to avoid multiple solutions, these analytic schemes model the points between the line segments as shocks (i.e., discontinuities in the slope), and properly track the movement of the shocks.

Block 110 reiterates the process back to block 102 until the process ends in block 112.

Figure 3:
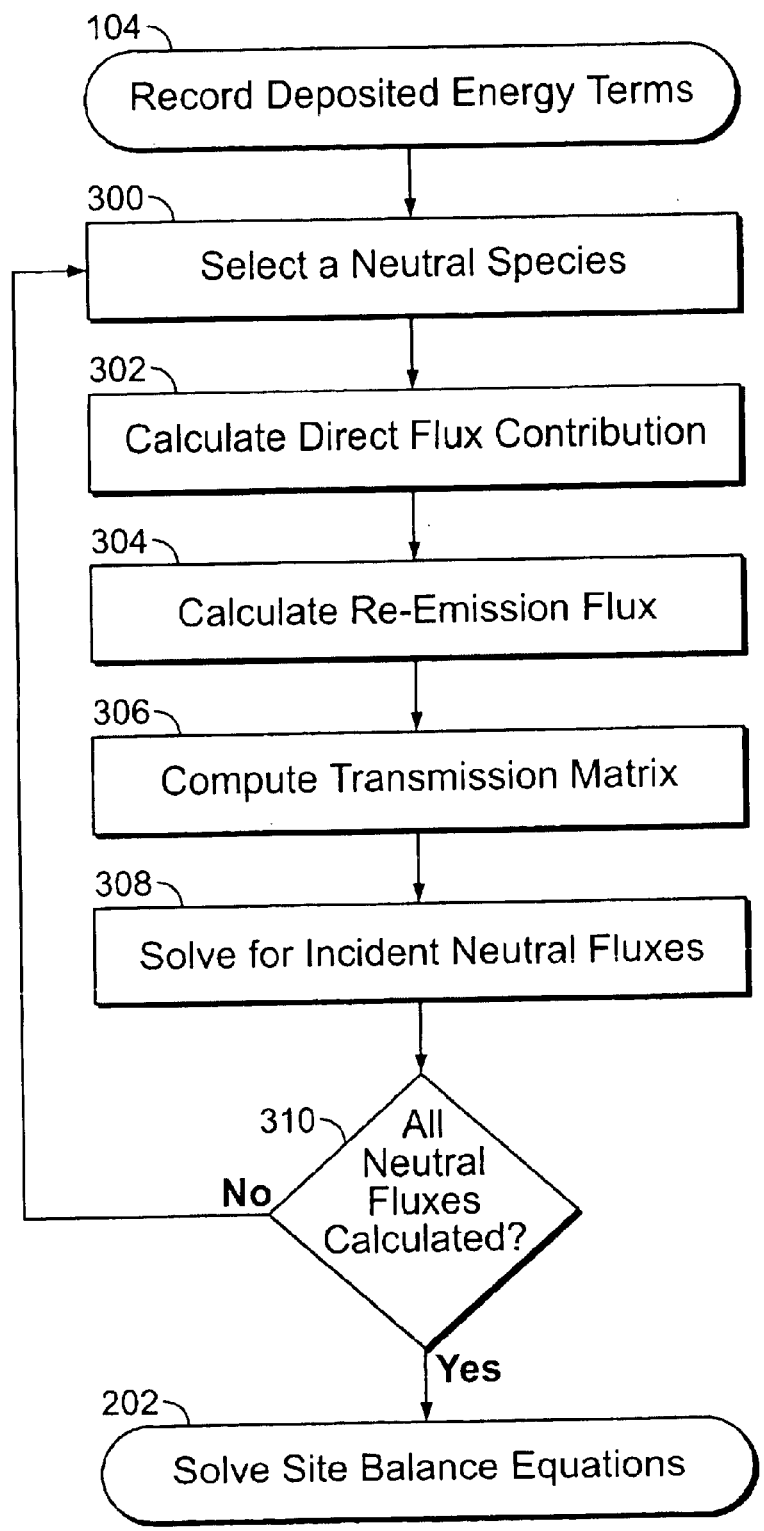
FIG. 3 is a flowchart illustrating a method to calculate neutral fluxes to surface segments.

FIG. 2 illustrates the calculation of coupled quantities including neutral fluxes, surface chemical coverage, and surface material types. Incident neutral fluxes are first computed in block 200. FIG. 3 illustrates the details of the incident neutral fluxes computation.

In block 202, surface chemical coverage on each surface segment are solved using previously computed fluxes and site balance equations with the assumption that the surface material type is of type given by the material under that surface segment and that of deposited film. Decision block 204 checks whether the surface chemical coverage on surface segment have converged. The computation of incident neutral fluxes to surface segments assumes a certain surface chemical coverage that is also dependent upon surface material types. Solving for the site balance equations yield a new computed surface chemical coverage that is then used to recalculate incident neutral fluxes. The new incident neutral fluxes is then used to solve the site balance equation again. The reiteration of the computation continues until the both neutral fluxes and surface chemical coverage become consistent with each other through the site balance model. Thus, both neutral fluxes and site balance equations are computed and solved for until the surface chemical coverage on each surface segment have converged.

The etch rate of depositing film on each surface segment defining the feature profile is then computed; in block 206. A representative etch/deposition rate equation may be illustrated by the following equation:

$$\text{Etch Rate} = R^{chem}\theta_{etchant} + Y_{ion}\theta_{etchant}/\rho_{deposited\ film} - S_{depositor}\Gamma_{depositor} \quad \text{(Equation 1)}$$

where $R^{chem}$ is a reaction rate, $\theta_{etchant}$ is a chemical coverage of neutral specie, $Y_{ion}$ is an ion yield term, $\rho_{deposited\ film}$ is a density of deposited film, $S_{depositor}$ is a sticking probability of depositing neutral specie, $\Gamma_{depositor}$ is an incident neutral flux of depositing neutral specie.

A decision block 208 checks whether the computed etch rate is negative, i.e. deposition. If the process determines that deposition has occurred, the material type of the surface segment is set to the depositing film in block 212. If the process determines that the etch rate is positive, i.e. etching, the material type of surface element is set to the underlying material type in block 210.

In block 214, the material type of each surface segment along a feature profile is checked for convergence. Because the computation of the etch rate of the depositing film in block 206 relies on the assumption that the surface material type is of type given by the material under that surface segment and that of deposited film, the surface chemical coverage is also dependent upon the surface material type and neutral fluxes. By setting the material type to either the underlying material type in block 210 or the deposited film in block 212, the material type may have changed and the process needs to maintain a consistent solution with the previously determined neutral fluxes and surface chemical coverage that are also dependent upon surface material type. Decision block 214's purpose is to maintain such consistency by checking whether the material type has converged. Once the coupled quantities have converged, the calculation proceeds to compute local etch and deposition rates in block 108 (FIG. 1).

FIG. 3 illustrates the analytic calculation of neutral fluxes. This calculation involves solving the following equation:

$$\Gamma_i = \Gamma_i^{direct} + \sum_j M_{ij}\Gamma_j^{reemission} + \sum_j T_{ij}\Gamma_j \quad \text{Equation 2}$$

where $\Sigma\Gamma_i$ is the total flux incident on segment i, $\Gamma_i^{direct}$ is the flux to segment i which arrives directly from plasma chamber, $\Gamma_i^{reemission}$ is the flux from segment i which results from liberation or creation of the neutral species, M is a matrix defined as the fraction of neutral emitted from segment j which will impact segment i, and T is a transmission matrix defined as the fraction of neutral incident on segment j which will reflect and impact segment i. The matrixes $\Gamma^{direct}$, M, and T are dependent on viewable angles from each discretized surface element to the plasma chamber and to the other discretized surface elements.

In blocks 300 and 302, for each neutral species, the direct flux contribution is calculated. The direct flux is defined as the flux incident on the surface which arrives directly from the plasma chamber without undergoing reflection elsewhere along the feature surface.

In block 304, the reemission flux arriving at segment i is computed by defining the reemitted flux from a segment j as:

$$\Gamma_j^{reemission} = \Gamma_j^{reemission\ from\ original\ material} + \Theta_{depositor\ or\ orginal}\Gamma_j^{reemission\ from\ film\ material}$$

Equation 2 where $\Theta_{depositor\ on\ original}$ is the fraction of the underlying or original surface covered by depositor. The reemitted flux from a surface is a function which may depend on surface coverages, surface material type, and incident neutral and ion flux distributions. The parameters governing reemission may be known or determined during the calibration of a profile simulator. The film material is defined as that material which forms by the accumulation of depositor species on the surface.

The transmission matrix, T, is computed in block 306. The reflection probability for a particle is equal to one minus the absorption probability on the original material minus the depositor coverage on original material multiplied by the absorption probability on film. The absorption probability for a particle incident on a surface is a function which may depend on surface coverage, surface material type, and incident neutral and ion flux distributions. The parameters governing adsorption probability may be known or determined during the calibration of the profile simulator. The film material is defined as that material which forms by the accumulation of depositor species on the surface.

In block 308, the incident neutral fluxes are solved throughout the feature using the above equation 1. If all neutral fluxes in block 310 have not been calculated, another neutral species is selected in 300 and the process restart at block 300. Otherwise the process stops at block 312.

Figure 4:
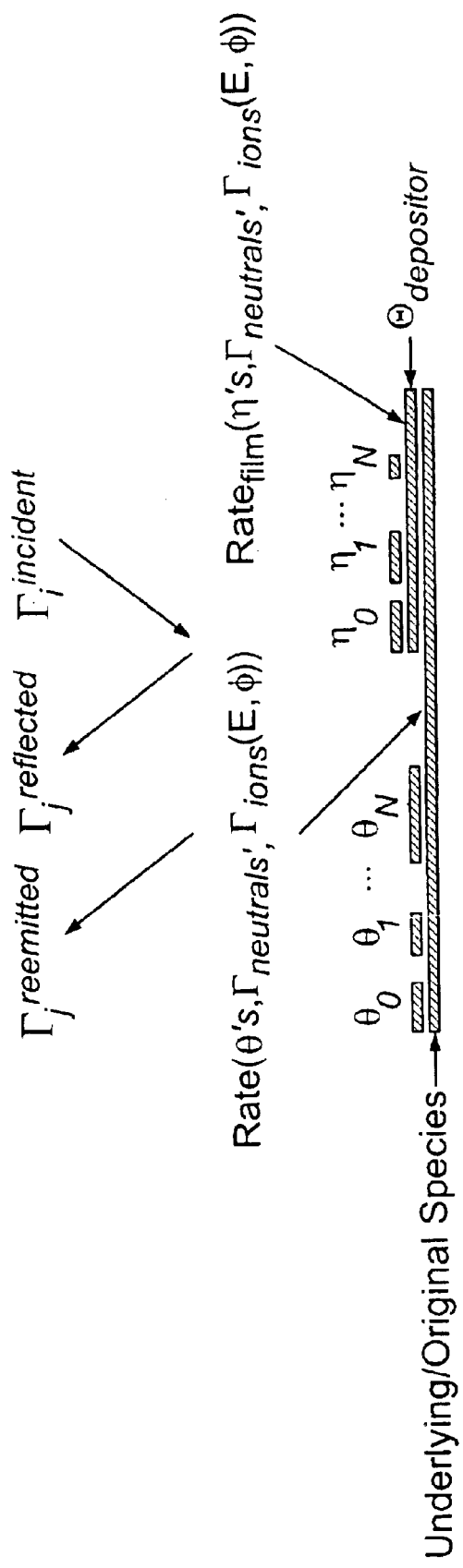
FIG. 4 is an elevational cross-sectional diagram depicting surface kinetics in a plasma process according to the Langmuir model.

FIG. 4 illustrates the interaction of fluxes with the feature surface which lead to solutions for the chemical coverage and/or concentration of relevant neutral species at the surface and computed etch and deposition rates. With reference to FIG. 4, $\Gamma_t^{incident}$ is the total incident flux of the $i^{th}$ species on a surface segment, $\Gamma_t^{reflected}$ is the portion of the incident flux of the $i^{th}$ species which is reflected from the surface, and $\Gamma_t^{reemitted}$ is the flux of the $i^{th}$ species which is reemitted through chemical reaction and/or energetic bombardment by accelerated species such as ions. In general $\Gamma_t^{reflected}$ and $\Gamma_t^{reemitted}$ may depend upon the chemical coverage or concentrations along the surface, on the incident flux distributions of neutrals and ions, on the surface material type, the surface temperature, and reaction rate constants. The overall occupancies of the underlying substrate surface sites resulting from reactions with N reactive neutral species are represented by fractions $\theta_0, \theta_1, \theta_2 \ldots \theta_N$. The overall occupancies of the surface sites on the portion of the surface covered by the depositing species, which are responsible for the macroscopic growth of film material along portions of the surface, resulting from reactions with N reactive neutral species are represented by fractions $\eta_0, \eta_1, \eta_2 \ldots \eta_N$. The equations used to compute the values of these surface coverage may depend on the coverage themselves, the incident flux distribution of neutral and energetic ion species, the temperature of the wafer, and reaction rate.

Equations for the etch rate of exposed material and the etch or deposition rate of film material can be expressed in terms of the chemical coverage on the appropriate material, the incident flux distribution of neutral and energetic ion species, the temperature of the wafer, and reaction rate constants as illustrated in FIG. 4. These rates are used to iteratively advance the feature surface in time thus predicting feature profile evolution.

Coverage for each neutral type are computed twice at each segment. A first set of coverage, $\theta$, are computed based on the assumption that the material type of the segment is the original/underlying material. The second set, $\eta$, assumes an underlying segment type of deposited film. These coverage are used to compute etch/deposition rates, emission rate, and adsorption probability separately for underlying and film material types. In calculating neutral flux transport, a segment is treated as a linear composition of the two material types where the portion of the surface assumed to be of film type is given by the coverage of depositor on underlying/original material.

The simulation of a plasma reactor process may also be enhanced by extrapolating the description of the feature profiles using Cartesian coordinates and azimuthally symmetric cylindrical coordinates with three degrees of freedom for particle velocity to three spatial degrees of freedom and three degrees of freedom for particle velocity.

Figure 5:
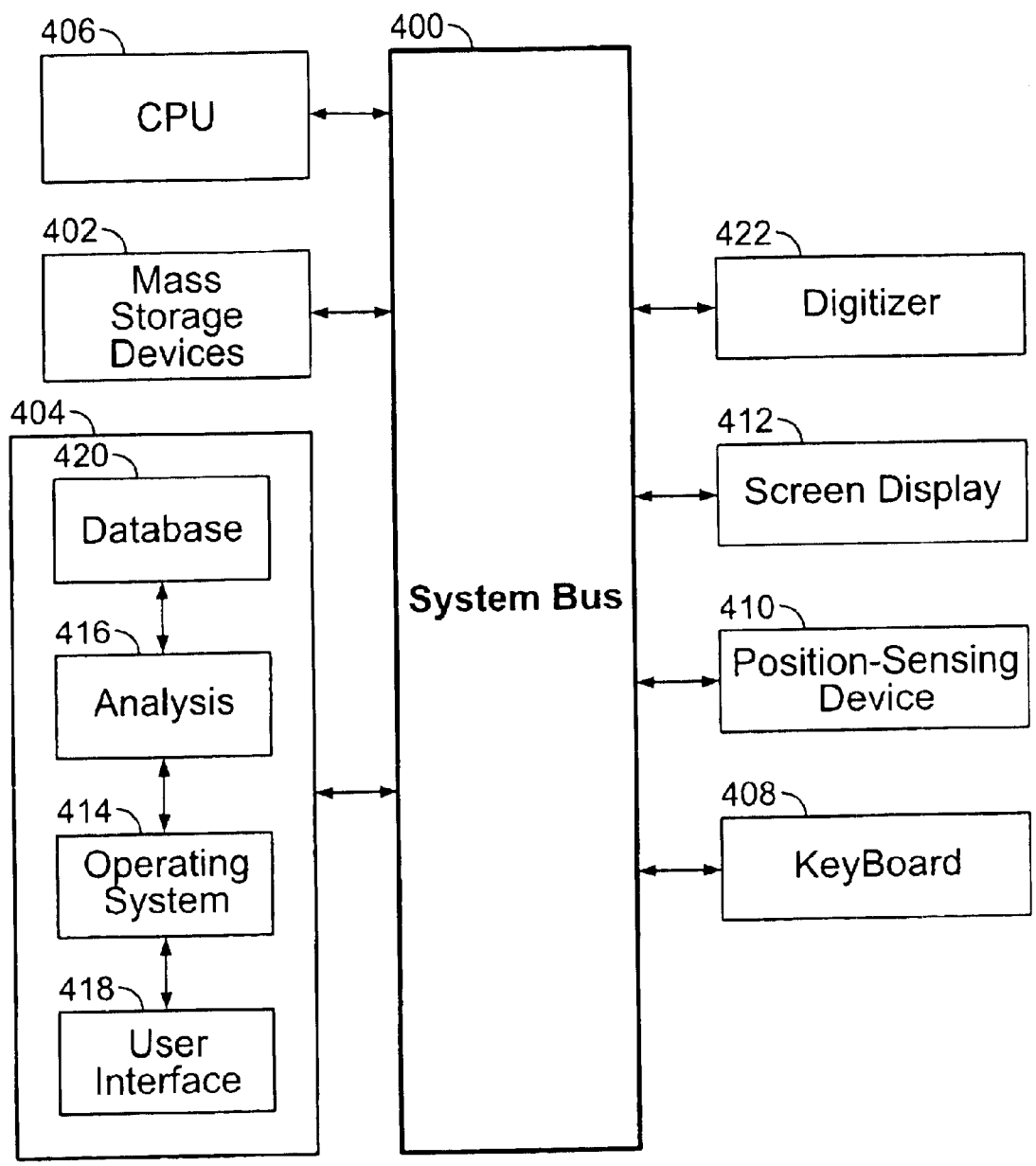
FIG. 5 is a system block diagram illustrating a representative hardware environment in accordance with a specific embodiment of the present invention.

Turning to FIG. 5, which illustrates, in block-diagram form, a hardware system incorporating the invention. As indicated therein, the system includes a system bus 400, over which all system components communicate, a mass storage device (such as a hard disk or optical storage unit) 402 as well as a main system memory 404.

The operation of the illustrated system is directed by a central-processing unit ("CPU") 406. The user interacts with the system using a keyboard 408 and a position-sensing device (e.g., a mouse) 410. The output of either device can be used to designate information or select particular areas of a screen display 412 to direct functions to be performed by the system.

The main memory 404 contains a group of modules that control the operation of CPU 406 and its interaction with the other hardware components. An operating system 414 directs the execution of low-level, basic system functions such as memory allocation, file management and operation of mass storage devices 402. At a higher level, an analysis module 416, implemented as a series of stored instructions, directs execution of the primary functions performed by the invention, as discussed below. Instructions defining a user interface 418 allow straightforward interaction over screen display 412. User interface 418 generates words or graphical images on display 412 to prompt action by the user, and accepts user commands from keyboard 408 and/or position-sensing device 410. The main memory 404 also includes one or more database 420, in general containing any of the test or process values of input parameters including input variables, the desired profile, the test surface profile and rough preliminary test values in the plasma model and profile simulator.

It must be understood that although the modules of main memory 404 have been described separately, this is for clarity of presentation only; so long as the system performs all necessary functions, it is immaterial how they are distributed within the system and its programming architecture.

The test surface profile(s) is produced experimentally, as is well known in the art, by subjecting one or more test substrates to a test process(es) in a plasma reactor and measuring the resulting surface profile using, for example, scanning electron microscopy. The desired and test surface profiles may be supplied to the hardware system in electronic format or as graphic hardcopy, in which case the image(s) is processed by a digitizer 398 before numerical comparison with the approximate prediction. The digitized profile is sent as bitstreams on the bus 400 to a database 420 of the main memory 404. The test surface profile may be stored in the mass storage device 402 as well as in database 420.

As noted above, execution of the key tasks associated with the present invention is directed by analysis module 416, which governs the operation of CPU 406 and controls its interaction with main memory 404 in performing the blocks necessary to provide a final mathematical surface profile model including calibrated optimum test values in the initial surface profile model; and, by further processing based on the final surface profile model and a desired surface profile, to determine process values of one or more input variables governing a plasma process sequence appropriates for creating the desired profile on a process substrate; or, by inserting process values of the input variables into the final mathematical model, to predictively calculate a process surface profile to be created on a process substrate by a plasma process sequence defined by the process values.

In particular, the hardware system depicted in FIG. 3 may be used to implement the calibration procedure illustrated by FIG. 1 as follows. The input variable test values selected in block 104, the test values of any fixed input parameter, and the test surface profile created in block 114 and, as needed, the desired surface profile and/or process values of interest are provided to the database 420 so that they are available to the analysis module 416. Alternatively, the module 416 may retrieve any of the test values, rough preliminary values and test surface profile data from the mass storage device 402 or user interface 418 in response to a user command. Or, the rough preliminary values may be determined by the module 416, based on the input variable test values, according to a predetermined algorithm.

Turning now to FIG. 1, by executing the plasma modeling and profile simulation of blocks 108 and 112, respectively, the module 416 establishes the initial mathematical surface model predicting the profile created by the test process. In block 116, the module 416 (FIG. 4) accesses the test surface profile and compares it with the initial mathematical surface profile model and evaluates the residual according to some predetermined criterion. If the residual is not sufficiently small, the analysis module 416 uses the results of the comparison to adjust the test values of the plasma model and profile simulator in block 118. The new test values are retained in the database 420 for another iteration of the modeling/simulation and comparison blocks. When the test surface profile and approximate prediction are sufficiently similar, the test values used in that final iteration are stored in the database 420 as the optimum values.

The analysis module uses these optimum values of the input variables for computation of process values, which can be loaded into a plasma reactor for production of a device including the desired profile, or for profile prediction as described above.

The speed and efficiency of the regression analysis to determine free parameters leading to best fit between test profiles and simulated profiles is improved by distributing the computation over a parallel computer or network of workstations.

It will therefore be seen that the foregoing represents a highly extensible and advantageous approach to plasma processing of semiconductor devices. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed. For example, the various modules of the invention can be implemented on a general-purpose computer using appropriate software instructions, or on a network of computers, or a multiprocessor computer or as hardware circuits, or as mixed hardware-software combinations (wherein, for example, plasma modeling and profile simulation are performed by dedicated hardware components).

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for enhancing a profile simulator algorithm, the method comprising:

tracking an energetic particle;

recording a plurality of ion fluxes from said energetic particle;

solving simultaneously for a plurality of neutral fluxes, a surface chemical coverage, a surface material type; and computing a local etch rate and a local deposition rate from said plurality of ion fluxes, said plurality of neutral fluxes, said surface chemical coverage, said surface material type.

2. A method as in claim 1 wherein said solving simultaneously for said plurality of neutral fluxes, said surface chemical coverage, said surface material type further comprising:

computing a plurality of neutral fluxes;

solving a self-consistent plurality of site balance equations;

calculating an etch rate of a depositing film; and adjusting said surface material type to said depositing film or an underlying material type; and reiterating said computing, solving, calculating, adjusting until said plurality of neutral fluxes, said surface chemical coverage, and said surface material type are self-consistent with each other.

3. A method as in claim 2 wherein computing a plurality of neutral fluxes further comprises:

selecting a neutral specie;

calculating a direct flux distribution for said neutral specie;

calculating a reemission flux for said neutral specie;

computing a transmission matrix for said neutral specie;

solving for neutral fluxes for said neutral specie; and repeating said selecting, said calculating said direct flux distribution, said calculating said reemission matrix, said computing, said solving another neutral specie until all neutral species have been selected.

4. The method of claim 1 further comprising:

distributing said solving and computing over a parallel computer or network of workstations.

5. A method of claim 1 further comprising:

tracking said energetic particle using three dimensional coordinates.

6. A program storage device readable by a machine, tangibly embodying a program of instructions readable by the machine to perform a method for enhancing a profile simulator algorithm, the method comprising:

tracking an energetic particle;

recording a plurality of ion fluxes from said energetic particle;

solving simultaneously for a plurality of neutral fluxes, a surface chemical coverage, a surface material type; and computing a local etch rate and a local deposition rate from said plurality of ion fluxes, said plurality of neutral fluxes, said surface chemical coverage, said surface material type.

7. An apparatus for a method for enhancing a profile simulator algorithm, the method comprising:

means for tracking an energetic particle;

means for recording a plurality of ion fluxes from said energetic particle;

means for solving simultaneously for a plurality of neutral fluxes, a surface chemical coverage, a surface material type; and means for computing a local etch rate and a local deposition rate from said plurality of ion fluxes, said plurality of neutral fluxes, said surface chemical coverage, said surface material type.

* * * * *

UNITED STATES PATENT AND TRADEMARK OFFICE
CERTIFICATE OF CORRECTION

PATENT NO. : 6,804,572 B1
DATED : October 12, 2004
INVENTOR(S) : Cooperberg et al.

It is certified that error appears in the above-identified patent and that said Letters Patent is hereby corrected as shown below:

Title page,
Item [56], References Cited, U.S. PATENT DOCUMENTS, insert:

| | | | | |
|---|---|---|---|---|
| -- 4,663,513 | 05/05/87 | Webber | 219 | 121 |
| 5,107,105 | 04/21/92 | Isobe | 250 | 225 |
| 5,225,740 | 07/06/93 | Ohkawa | 315 | 111.41 |
| 5,270,222 | 12/14/93 | Moslehi | 437 | 8 |
| 5,399,229 | 03/21/95 | Stefani et al. | 156 | 626 |
| 5,422,139 | 06/06/95 | Fischer | 427 | 248.1 |
| 5,654,903 | 08/05/97 | Reitman et al. | 364 | 551.01 |
| 5,679,599 | 10/21/97 | Mehta | 437 | 69 |
| 5,711,843 | 01/27/98 | Jahns | 156 | 345 |
| 5,737,496 | 04/07/98 | Frye et al. | 395 | 23 |
| 5,869,402 | 02/09/9 | Harafuji et al. | 438 | 729 |
| 5,933,345 | 08/03/99 | Martin et al. | 364 | 164 |
| 5,949,678 | 09/07/99 | Wold et al. | 364 | 188 |
| 5,963,710 | 10/05/99 | Masumoto | 395 | 94 -- |

FOREIGN PATENT DOCUMENTS, insert:
-- 0 602 855 A1    03.12.93    Europe    H01J 37    32 --
OTHER PUBLICATIONS, insert:
-- Li et al., "Simulation and Experimental Analysis of Planarization of Refractory Metals Using a Multi-Step Sputter/Sputter Etch Process", 1994, Journal of Electronic Materials, Vol. 23, No. 11, pp. 1215-1220.
Liao et al., "Simulations of metal thin film thermal flow processes", Jul/Aug 1996, J. Vac. Sci. Technol. B, Vol. 14, No. 4, pp. 2615-2622.
Moyne et al., "Adaptive extensions to a multibranch run-to-run controller for plasma etching", May/Jun 1995, J. Vac. Sci. Technol. A, Vol. 13, No. 13, pp. 1787-1791.
Reitman, Edward A., "Neural networks in plasma processing", Jan/Feb 1996, J. Vac. Sci. Technol. B, Vol. 14, No. 1, pp. 504-510.
Singh et al., "The effect of surface transport on the evolution of film microstructure in plasma etching and deposition", 1997, Microelectronic Engineering 35, pp. 37-40.
Thallikar et al., "Experimental and simulation studies of thermal flow of borophosphosilicate and phosphosilicate glasses", July/Aug. 1995, J. Vac. Sci. Technol. B, Vol. 13, No. 4, pp. 1875-1878.
Vahedi et al., "Capacitive RF discharges modelled by particle-in-cell Monte Carlo simulation. I: analysis of numerical techniques", 1993, Plasma Sources Sci. Technol. 2, pp. 261-272.
Vahedi et al., "Capacitive RF discharges modelled by particle-in-cell Monte Carlo simulation. II: comparisons with laboratory measureents of electron energy distribution functions", 1993, Plasma Sources Sci. Technol. 2, pp. 273-278.

UNITED STATES PATENT AND TRADEMARK OFFICE
CERTIFICATE OF CORRECTION

PATENT NO. : 6,804,572 B1
DATED : October 12, 2004
INVENTOR(S) : Cooperberg et al.

It is certified that error appears in the above-identified patent and that said Letters Patent is hereby corrected as shown below:

Title page (cont'd),
Bailey et al., "Scaling of Si and GaAs trench etch rates with aspect ratio, feature width, and substrate temperature", Jan.Feb 1995, J. Vac. Sci. Technol., B, Vol. 13, No. 1, pp. 92-104.
Barone et al., "Molecular dynamics simulatins of plasma-surface chemistry", 1996, Plasma Sources Sci. Technol. 5, pp. 187-192.
Chang et al., "Plasma-surface kinetics and feature profile evolution in chlorine etching of polysilicon", Jan/Feb 1998, J. Vac. Sci. Technol. A, Vol. 16, No. 1, pp. 217-224.
Gottscho et al., "Microscopic uniformity in plasma etching", Sep./Oct. 1992, J. Vac. Sci. Technol. B, Vol. 10, No. 5, pp. 2133-2147.
Hamaguchi et al., "Liner conformality in ionized magnetron sputter metal deposition processes", July/Aug. 1996, J. Vac. Sci. Technol. B, Vol. 14, No. 4, pp. 2603-2608.
Hamaguchi, S., "Mathematical Methods for Thin Film Deposition Simulations", 1996, Thin Films, Vol. 22, pp. 81-115.
Han et al., "Profile modeling of high density plasma oxide etching", July/Aug. 1995, J. Vac. Sci. Technol. B, Vol. 13, No. 4, pp. 1893-1899. --

Column 7,
Lines 15-19, delete "or" and replace with -- on --.

Signed and Sealed this

Second Day of August, 2005

JON W. DUDAS
*Director of the United States Patent and Trademark Office*